(12) United States Patent
Dupre et al.

(10) Patent No.: US 12,733,290 B2
(45) Date of Patent: Sep. 8, 2026

(54) PROCESS FOR FABRICATING AN OPTOELECTRONIC DEVICE COMPRISING A STEP OF PRODUCING A THIN CONDUCTIVE LAYER CONFORMALLY AND CONTINUOUSLY BY DIRECTIONAL DEPOSITION

(71) Applicant: COMMISSARIAT A L'ENERGIE ATOMIQUE ET AUX ENERGIES ALTERNATIVES, Paris (FR)

(72) Inventors: Ludovic Dupre, Grenoble Cedex (FR); Hélène Fournier, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 389 days.

(21) Appl. No.: 18/293,155

(22) PCT Filed: Jul. 27, 2022

(86) PCT No.: PCT/EP2022/071135
§ 371 (c)(1),
(2) Date: Jan. 29, 2024

(87) PCT Pub. No.: WO2023/006846
PCT Pub. Date: Feb. 2, 2023

(65) Prior Publication Data

US 2024/0332437 A1 Oct. 3, 2024

(30) Foreign Application Priority Data

Jul. 30, 2021 (FR) ....................................... 2108386

(51) Int. Cl.
*H10F 77/20* (2025.01)
*H10H 20/01* (2025.01)
*H10H 20/831* (2025.01)

(52) U.S. Cl.
CPC ....... *H10F 77/206* (2025.01); *H10H 20/8314* (2025.01); *H10H 20/032* (2025.01)

(58) Field of Classification Search
CPC . H10F 77/206; H10H 20/8314; H10H 20/032
See application file for complete search history.

(56) References Cited

U.S. PATENT DOCUMENTS

2019/0319066 A1 10/2019 Tan et al.
2020/0119231 A1 4/2020 Gibert et al.
2021/0135150 A1 5/2021 Wang et al.

FOREIGN PATENT DOCUMENTS

FR 3 068 514 A1 1/2019

OTHER PUBLICATIONS

International Search Report & Written Opinion mailed on Nov. 23, 2022 in PCT/EP2022/071135 filed on Jul. 27, 2022 (13 pages with translation).

*Primary Examiner* — Jay C Kim
*Assistant Examiner* — Woo K Lee
(74) *Attorney, Agent, or Firm* — Oblon, McClelland, Maier & Neustadt, L.L.P.

(57) ABSTRACT

A method for manufacturing an optoelectronic device comprising a substrate and wire diodes having an h:d spacing aspect ratio that is at least equal to 1, the method comprising a step of producing a conductive thin film by directional physical vapour deposition, the substrate experiences a periodic rotational movement and a periodic oscillation movement so that the conductive thin film is deposited on the substrate and the sides of the wire diodes in a conformal and continuous manner.

12 Claims, 5 Drawing Sheets

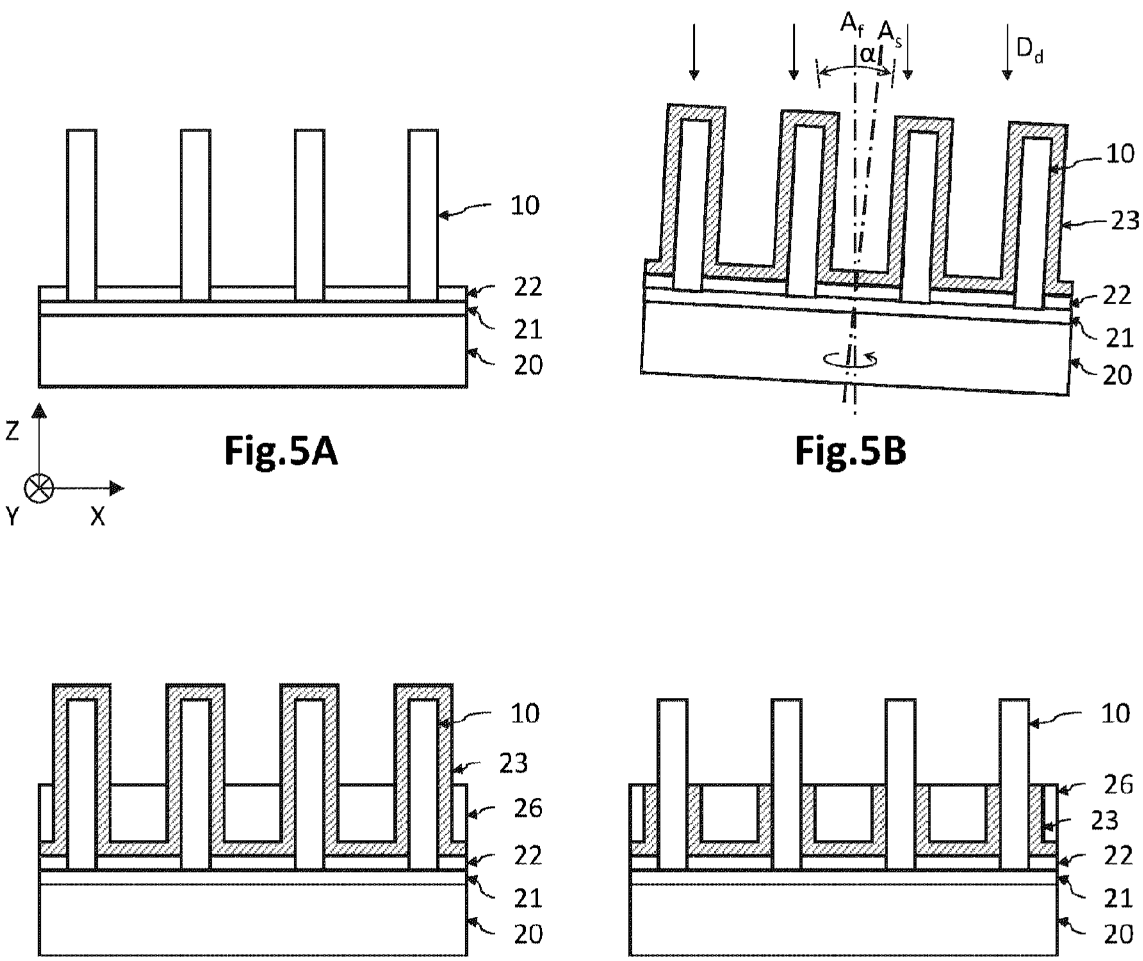
Fig.5A
Fig.5B
Fig.5C
Fig.5D
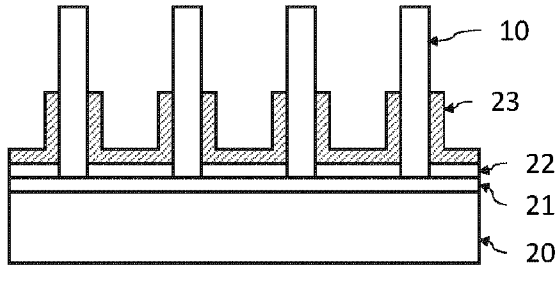
Fig.5E

PROCESS FOR FABRICATING AN OPTOELECTRONIC DEVICE COMPRISING A STEP OF PRODUCING A THIN CONDUCTIVE LAYER CONFORMALLY AND CONTINUOUSLY BY DIRECTIONAL DEPOSITION

TECHNICAL FIELD

The field of the invention relates to methods for manufacturing an optoelectronic device comprising light-emitting or light-receiving wire diodes that rest on a substrate, and more specifically relates to the production, on the front face of the substrate, of a thin film electrode adapted to bias the wire diodes.

PRIOR ART

Optoelectronic devices exist that comprise three-dimensional semiconductor structures of the nanowire or microwire type forming, for example, light-emitting diodes, called wire light-emitting diodes. Wire diodes usually comprise a first portion extending from the substrate that is doped, for example, with n-type doping, and a second portion that rests on the first doped portion that is doped with the opposite type of conductivity, for example, with p-type doping, between which portions an active zone is located that ensures the emission of the light radiation.

The electrical biasing of the first doped portions can be carried out on the front face of the substrate, for example, by means of a nucleation film made of an electrically conductive material. Such an example is notably described in document EP 3479409 A1 and in document WO 2019/129978 A1. However, this requires the use of a material that is not only electrically conductive but is also suitable for epitaxial growth of wire diodes.

It is also known for the substrate to be locally doped so that it has n-type doped zones, flush with the front face of the substrate, allowing charge carriers to travel to the foot of the wire diodes. Such an example is notably described in document WO 2015/044619 A1. However, this requires carrying out prior steps of localised doping of the growth substrate.

Therefore, a requirement exists for a method for manufacturing such a wire diode optoelectronic device that ensures simple and effective electrical biasing of the wire diodes on the front face of the substrate.

DISCLOSURE OF THE INVENTION

The aim of the invention is to at least partly overcome the disadvantages of the prior art, and more specifically to propose a method for manufacturing a wire diode optoelectronic device, comprising a step of producing a thin film lower electrode by directional deposition, which electrode extends over the front face of the substrate in a conformal and continuous manner.

To this end, the aim of the invention is a method for manufacturing an optoelectronic device comprising: a substrate, and a plurality of light-emitting or light-detecting wire diodes resting on the substrate, each having an average height h and being spaced apart with an average relative spacing d from side to side, such that an h:d spacing aspect ratio is at least equal to 1.

The method comprises a step of producing a lower conductive thin film, made of at least one electrically conductive material, and intended to form a lower electrode, which step is carried out by directional physical vapour deposition in a main deposition direction $D_d$ oriented towards the substrate and the wire diodes, resulting in an incident material flow of the electrically conductive material.

During deposition, the substrate rests on a support of a substrate holder, the support experiencing: a periodic rotational movement so that the sides of the wire diodes are exposed to the incident material flow at a rotation frequency $f_r$; and a periodic oscillation movement of an angle of inclination $\alpha$ formed between a main axis $A_s$ orthogonal to the substrate and a fixed axis $A_f$ parallel to the main deposition direction $D_d$ ranging at most up to a threshold value $\alpha_{th}$ equal to arctan(d:h) and including the value κ°, at an angular oscillation frequency $f_o$; the frequencies of rotation $f_r$ and of angular oscillation $f_o$ being predefined so that the lower conductive thin film is deposited on the substrate and the sides of the wire diodes in a conformal and continuous manner.

Some preferred but non-limiting aspects of this manufacturing method are as follows.

The step of producing the lower conductive thin film can be carried out by evaporation or ion beam sputtering.

The support and therefore the substrate can experience a rotation movement about the main axis $A_s$ and an angular oscillation movement of the main axis $A_s$ relative to the fixed axis $A_f$, so that the angle of incidence $\alpha$ varies between $-\alpha_m$ and $+\alpha_m$, where the maximum value $\alpha_m$ is at most equal to the threshold value $\alpha_{th}$.

The support and therefore the substrate can experience a rotation movement of the main axis $A_s$ about the fixed axis $A_f$, with the fixed axis $A_f$ intersecting the main axis $A_s$, and can experience an angular oscillation movement of the angle of incidence $\alpha$, so that the angle of incidence $\alpha$ varies between 0 and $+\alpha_m$, where the maximum value $\alpha_m$ is at most equal to the threshold value $\alpha_{th}$.

The wire diodes can be made from an III-V, II-VI compound or from an IV element or compound.

The wire diodes can have an average height h ranging between 500 nm and 5,000 nm, and the average relative spacing can range between 50 nm and 500 nm, while complying with a spacing aspect ratio that is at least equal to 1.

During the step of producing the lower conductive thin film, the wire diodes can be completely covered by the lower conductive thin film.

The wire diodes can comprise, starting from the substrate and along the main axis $A_s$, a first portion doped according to a first type of conductivity, an active zone and a second portion doped according to a second type of conductivity opposite to the first type.

The manufacturing method can comprise a step of removing part of the lower conductive thin film extending over the active zone and the second doped portion, in order to retain only part of the lower conductive thin film extending over the first doped portion.

The removal step can be configured so that, subsequently, the lower conductive thin film extends over the first doped portion of the wire diodes to a height $h_{ei}$ that is greater than a thickness $e_{ei}$ of the lower conductive thin film extending over the substrate.

BRIEF DESCRIPTION OF THE DRAWINGS

Further aspects, aims, advantages and features of the invention will become more clearly apparent from reading the following detailed description of preferred embodiments thereof, which are provided by way of a non-limiting example and with reference to the appended drawings, in which:

FIGS. 5A to 5E illustrate various steps of a method for manufacturing an optoelectronic device according to the first embodiment.

DETAILED DISCLOSURE OF PARTICULAR EMBODIMENTS

Figure 1A:
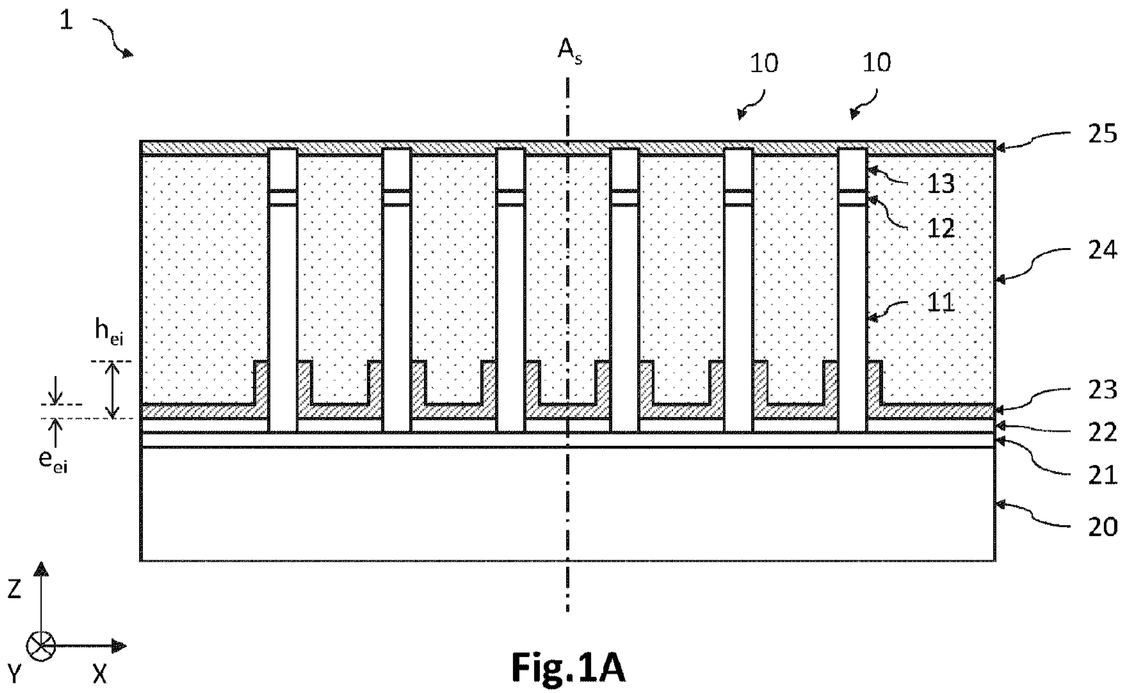
FIG. 1A is a schematic and partial cross-sectional view of an optoelectronic device obtained by a manufacturing method according to one embodiment, in which the lower electrode is a thin film that extends over the substrate and over the feet of the wire diodes in a conformal and continuous manner.

In the figures and throughout the remainder of the description, the same reference signs represent identical or similar elements. In addition, the various elements are not shown to scale so as to enhance the clarity of the figures. Furthermore, the various embodiments and alternative embodiments are not mutually exclusive and can be combined with one another. Unless otherwise indicated, the terms "substantially", "approximately", "of the order of" mean to the nearest 10%, and preferably to the nearest 5%. Furthermore, the terms "ranging between . . . and . . . " and the like mean that the limits are inclusive, unless otherwise stated.

The invention relates to a method for manufacturing an optoelectronic device comprising wire diodes of the light-emitting diode or photodiode type. In particular, it comprises a step of producing a conductive thin film, intended to form a lower electrode, extending in a conformal and continuous manner over the substrate and the feet of the wire diodes, by means of a directional physical vapour deposition technique. The manufacturing method then allows a lower thin film electrode to be obtained that is located on the front face of the substrate, and allows improved injection of charge carriers at the feet of the wire diodes.

The wire diodes are three-dimensional semiconductor structures that assume an elongated shape along a main axis $A_s$ orthogonal to the substrate, i.e., their longitudinal dimensions (average height h) along the main axis $A_s$ are greater than their transverse dimensions (average diameter). The diodes are then called wire diodes. The transverse dimensions of the wires, i.e., their dimensions in a plane orthogonal to the main axis $A_s$, form an average diameter ranging between 5 nm and 5 μm. The average height h of the wire diodes is greater than the average diameter, for example, 2 times, 5 times and preferably at least 10 times greater. The wire diodes can also assume a shape where the sides are not vertical (namely, nano- or micro-pyramids).

The cross-section of the wires, in a plane orthogonal to the main axis $A_s$, can assume various shapes, for example, a circular, oval, polygonal, for example, triangular, square, rectangular or even hexagonal shape. The diameter is defined herein as being a quantity associated with the perimeter of the wire on a cross-section. It can be the diameter of a disc with the same surface area as the cross-section of the wire. The local diameter is the diameter of the wire at a given height thereof along the main axis $A_s$. The average diameter is the average, for example, the arithmetical average, of the local diameters along the wire or a portion thereof.

The wire diodes rest on a substrate and are spaced apart from one another with an average relative spacing d from side to side, i.e., over an average distance in a plane parallel to the substrate running from a wire diode side to a side of an adjacent wire diode. A spacing aspect ratio then can be defined as the h:d ratio of the average height h to the average relative spacing d. Within the scope of the invention, this spacing aspect ratio is at least equal to 1, and preferably at least equal to 5 or even more. In other words, the wire diodes have a high average height h relative to the average relative spacing d, and/or a low average relative spacing d relative to the average height h.

In addition, the manufacturing method according to the invention more specifically comprises a step of producing a conductive thin film on the front face of the substrate that is intended to form a biasing electrode, called lower electrode, so that the lower electrode extends in a continuous and conformal manner over the substrate and at least part of the wire diodes. The lower electrode is then able to electrically bias all or at least some of the wire diodes, which are then connected in parallel. A thin film is understood to mean a film that in this case is deposited using a directional physical vapour deposition technique, the thickness of which film is preferably less than the average diameter of the wire diodes, for example, the average diameter divided by 2.

Thus, each part of the conductive thin film located on the sides of a wire diode is continuously connected to the part that extends over the substrate (in this case over a nucleation film or a growth mask) and surrounds the foot of each wire diode. The deposited conductive thin film assumes the form of a film deposited in a conformal manner (conformal deposition), even though it is produced using a directional physical vapour deposition technique, in a predefined main deposition direction $D_d$. Directional physical vapour deposition can be, among other things, deposition by Joule effect vacuum evaporation or by electron beam evaporation, or by ion beam sputtering.

A directional deposition technique is therefore used that does not belong to the family of conformal thin film deposition techniques, but in this case the deposition of the conductive thin film is made conformal by the rotation and angular oscillation movements described hereafter. Thus, due to the definition of conformal deposition, the conductive thin film follows the topology of the elements that it covers. It therefore has a homogeneous or substantially homogeneous thickness, defined along an axis orthogonal to the surface that it covers. In other words, the thickness can be constant or substantially constant, i.e., it can vary between a maximum value on the substrate and a minimum value on the sides of the wire diodes. By way of an illustration only, for conformal deposition of a 20 nm thin film, the thickness of the film can vary, under certain conditions (for example, with the very high h:d spacing ratio), between a value of 1 nm on the lateral sides of the wire diodes and a value of 20 nm on the surface of the substrate.

FIG. 1A is a schematic and partial cross-sectional view of an optoelectronic device 1 obtained using a manufacturing method according to one embodiment. The optoelectronic device 1 comprises a matrix of wire diodes 10, in this case GaN-based light-emitting diodes in an axial configuration. However, the wire diodes 10 can assume other configurations, such as a core-shell configuration.

In this case, and throughout the remainder of the description, a three-dimensional orthonormal XYZ reference frame is defined where the XY plane is substantially parallel to the plane of a substrate 20 of the optoelectronic device 1, with the Z axis being oriented in a direction orthogonal to the plane of the substrate 20 towards the wire diodes 10.

In this example, the optoelectronic device 1 comprises:

- a substrate 20, for example, made of an electrically insulating or conductive material, having two faces, called rear and front faces, that are opposite each other;
- a nucleation film 21, made of a material suitable for epitaxial growth of wire diodes 10 and being electrically insulating in this case, covering the front face of the substrate 20; and
- a growth mask 22, made of an electrically insulating material;
- a lower conductive thin film 23, intended to form the lower electrode, in this case extending in a conformal and continuous manner over the substrate 20 and over a lower part of the wire diodes 10;
- wire diodes 10, which extend from the nucleation film 21 along a main axis $A_s$ of the substrate 20, oriented orthogonal to the substrate 20; and
- an encapsulation film 24, made of an electrically insulating material, which fills the lateral space between the wire diodes 10 and covers them;
- an upper conductive thin film 25, intended to form the upper electrode, resting on the encapsulation film 24, and in contact with an upper part of the wire diodes 10.

The substrate 20 can be a single-piece structure made of the same material or can be a multifilm structure. It can be made of an IV semiconductor compound, for example, silicon, germanium, silicon carbide, or an III-V compound (such as AlN or GaN) or II-VI. It also can be made of a metal material or an insulating material such as sapphire. In this example, it is made from silicon.

The front face of the substrate 20 in this case is covered by a nucleation film 21. This nucleation film is made of a material that promotes the nucleation and epitaxial growth of the wire diodes 10, and can be an aluminium oxide (such as $Al_2O_3$), a magnesium nitride $Mg_xN_y$, or a nitride or carbide of a transition metal, or any other material that in this case is suitable for GaN epitaxy. The thickness of the nucleation film 21 can be of the order of a few nanometres to a few hundred nanometres.

The nucleation film 21 in this case is covered by a dielectric film 22 forming a growth mask, which comprises openings opening onto the nucleation film 21 and allowing epitaxial growth of the wire diodes 10. The dielectric film 22 is made of at least one electrically insulating material, for example, a silicon oxide or nitride, such as $SiO_2$ or $Si_3N_4$. In this example, the dielectric film 22 is made of $SiO_2$.

Each wire diode 10 in this case is a light-emitting diode in an axial configuration. It extends longitudinally parallel to the main axis $A_s$ of the substrate. It comprises, along the main axis $A_s$, a first doped portion 11, in this case of the n-type, for example, extending in contact with and from the nucleation film 21, an active zone 12, from which most of the light radiation from the diode is emitted, and a second doped portion 13, in this case of the p-type.

The wire diodes 10 in this case are in an axial configuration insofar as each active zone 12 essentially covers an upper face of the first doped portion 11 and extends along the main axis $A_s$. In addition, each second doped portion 13 essentially covers an upper face of the active zone 12 and also extends along the main axis $A_s$. The wire diodes 10 in this case differ from the core-shell configuration (which nevertheless can be implemented within the scope of the method according to the invention).

Each wire diode 10 in this case is made from GaN, but more generally from at least one semiconductor material, which can be selected from among the III-V compounds comprising at least one element from column III and at least one element from column V of the periodic table, the II-VI compounds comprising at least one element from column II and at least one element from column VI, or the IV elements or compounds comprising at least one element from column IV.

The wire diodes 10 are evenly distributed over the substrate 20, with an average relative spacing d from side to side. An aspect ratio of the spacing between the wire diodes 10 then can be defined as the h:d ratio corresponding to the ratio of the average height h to the average relative spacing d. The average height can range between 100 nm and 10,000 nm, for example, between 500 nm and 5,000 nm, and preferably between 800 nm and 1,200 nm. The average relative spacing can range between 50 nm and 500 nm, or even between 80 nm and 120 nm. In any event, the h:d aspect ratio is at least equal to 1, or even 5 or 10.

In addition, the conductive thin film 23 extends in a conformal and continuous manner over the substrate 20 and over a lower part of each wire diode 10 (foot of the wire diode). It can therefore ensure the electrical biasing of the wire diodes 10, i.e., the application of the same electrical potential to each first doped portion 11 of the wire diodes 10, which diodes are then connected in parallel.

The conductive thin film 23 is made of at least one electrically conductive material, such as, for example, a metal material such as aluminium or silver, or a transparent conductive material, such as indium tin oxide (ITO) or any other material allowing electrical contact to be established on the first doped portion 11. The average thickness $e_{ei}$ of the conductive thin film 23 can range between 50 nm and 500 nm, for example, it can be equal to 100 nm.

It extends over the substrate 20 and the wire diodes 10 in a conformal manner, i.e., it has a non-zero thickness both on the substrate 20 and on the feet of the wire diodes 10. In order to improve the electrical biasing of the wire diodes, it extends along the feet of the wire diodes 10 over an average height $h_{ei}$ that is greater than its average thickness $e_{ei}$, for example, equal to approximately 500 nm. In addition, it extends continuously, i.e., the part that continuously extends over the substrate 20 is also continuously connected to the parts that extend over the feet of the wire diodes 10.

The wire diodes 10 are covered by an encapsulation film 24, made of a dielectric material and at least partially transparent to the light radiation emitted by the wire diodes 10. This can be, for example, a silicon oxide (for example, $SiO_2$) or aluminium oxide for example, $Al_2O_3$), a silicon nitride $SiN_x$, or any other suitable material, such as a polymer, for example. The thickness of the encapsulation film 24 is such that it covers the wire diodes 10, but leaves part of the second doped portion 13 of the wire diodes 10 flush with the surface.

Finally, an upper conductive thin film 25, intended to form the upper electrode, extends over the encapsulation film 24 and comes into contact with the second doped portion 13 of each wire diode 10. It is made of an electrically conductive material that is transparent to the light radiation emitted by the diodes. The material can be, for example, indium tin oxide (ITO) or gallium doped zinc oxide (GZO), or even can be aluminium or indium doped. Transparent, or at least partially transparent, is understood to mean a material that transmits at least 50% of the incident light, and preferably at least 80% or more.

Figure 1B:
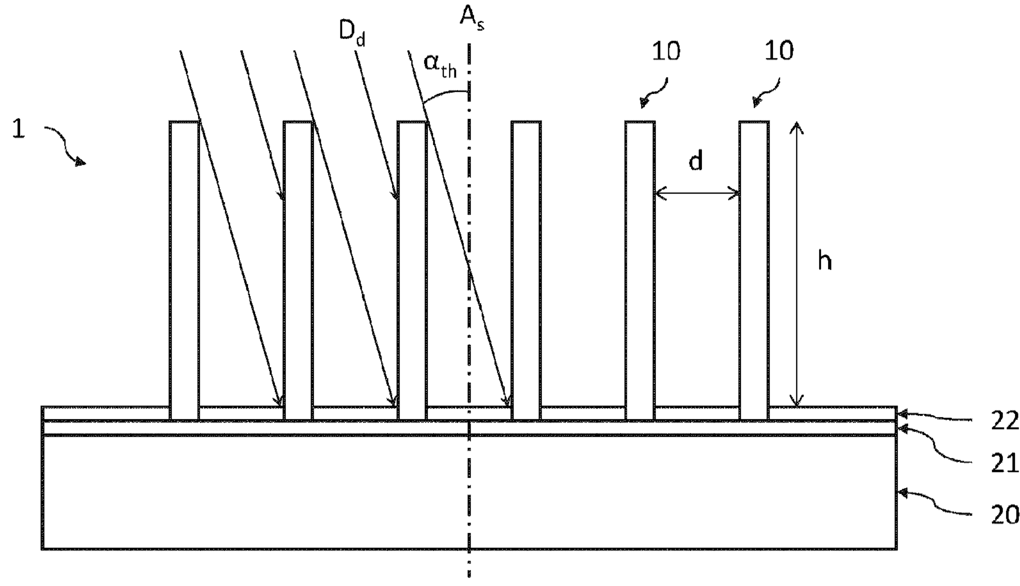
FIG. 1B is a schematic and partial cross-sectional view of part of the optoelectronic device illustrated in FIG. 1A, illustrating the h:d aspect ratio of the spacing between the wire diodes and the main deposition direction $D_d$ of the lower thin film electrode.

FIG. 1B is a simplified view of part of the optoelectronic device 1 illustrated in FIG. 1A, before the step of producing the lower conductive thin film 23.

The h:d spacing aspect ratio of the wire diodes 10 relative to the main deposition direction $D_d$ (or direction of incidence) of the flow of material intended to form the lower electrode 23 is highlighted in this case.

Indeed, insofar as this production step is carried out by directional physical vapour deposition (evaporation, IBS sputtering, etc.), the flow of material is oriented, on the substrate 20 and the wire diodes 10, in a predefined main direction $D_d$.

This main direction $D_d$ may or may not be inclined relative to the main axis $A_s$ orthogonal to the substrate 20. An angle of inclination $\alpha$ is then defined, which can be zero when the main axis $A_s$ is parallel to the main direction $D_d$, or which is non-zero when the main axis $A_s$ is inclined relative to this main direction $D_d$.

It then can be seen that, depending on the h:d spacing aspect ratio and the angle of inclination $\alpha$, a shading phenomenon can occur, which is expressed by the fact that the conductive thin film 23 can assume various very different configurations depending on the value of the angle of inclination $\alpha$, some of which are not very conducive to ensuring effective electrical biasing of the first doped portions 11 of the wire diodes 10, while other configurations do not allow this electrical biasing to be provided.

This shading phenomenon occurs when the angle of incidence $\alpha$ is greater than a threshold value $\alpha_{th}$ equal to arctan(d:h). Below this threshold value $\alpha_{th}$, the flow of material reaches the surface of the substrate 20, and above this threshold value, this is no longer the case.

Figure 2A:
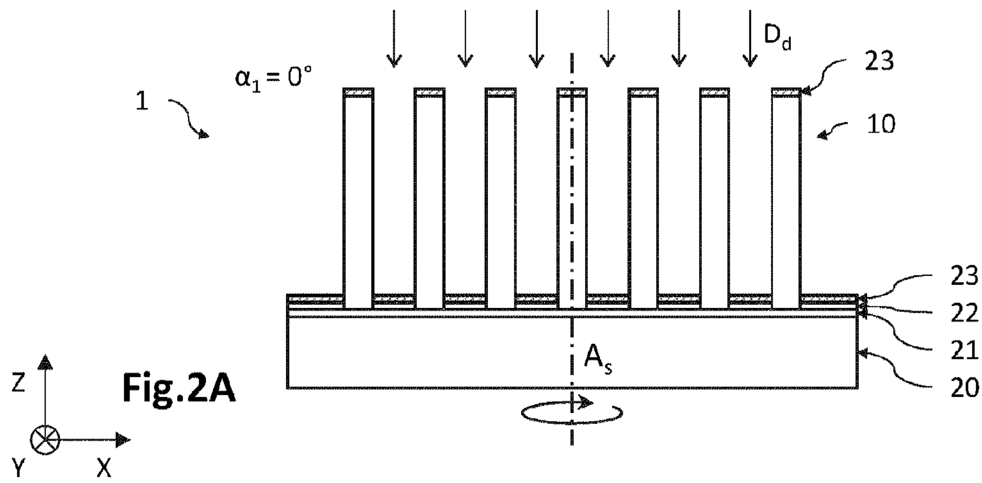
FIGS. 2A to 2C are schematic and partial cross-sectional views of a wire diode optoelectronic device, illustrating various deposition configurations for the lower thin film electrode for various angle of inclination $\alpha$ values between the main deposition direction and the main axis $A_s$ of the substrate.
Figure 2B:
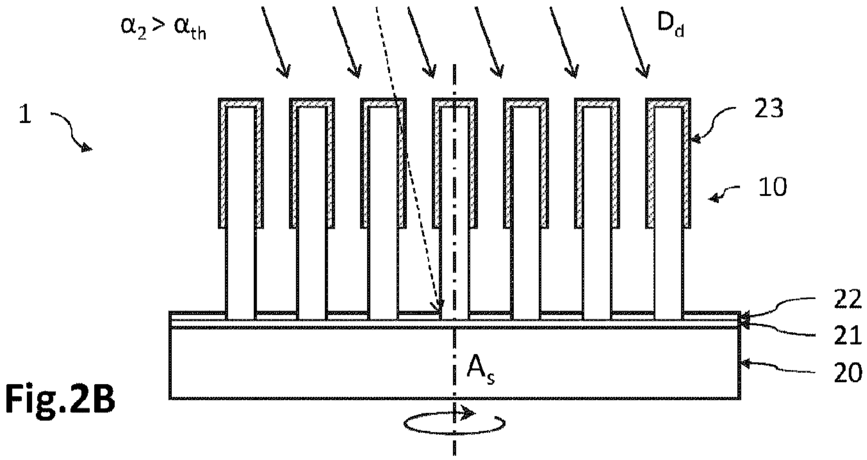
Figure 2C:
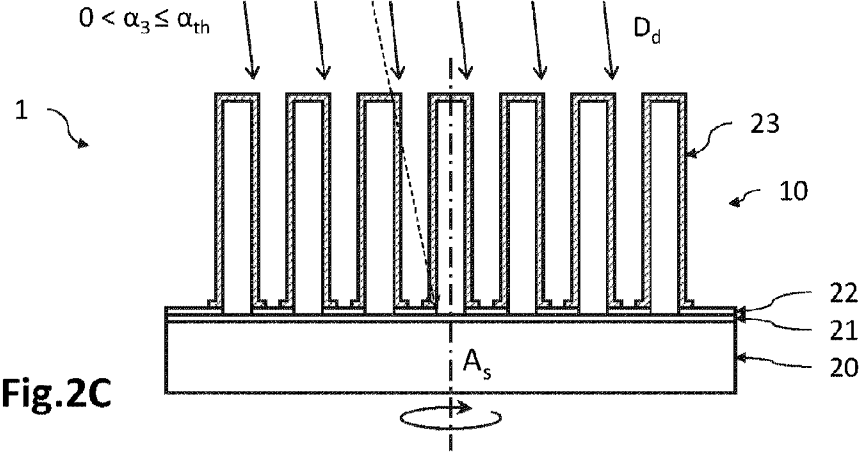

To this end, FIGS. 2A to 2C are schematic and partial cross-sectional views of an optoelectronic device 1 after the step of producing the lower conductive thin film 23, for various values of the angle of inclination $\alpha$ and therefore for various obtained configurations.

Figure 3A:
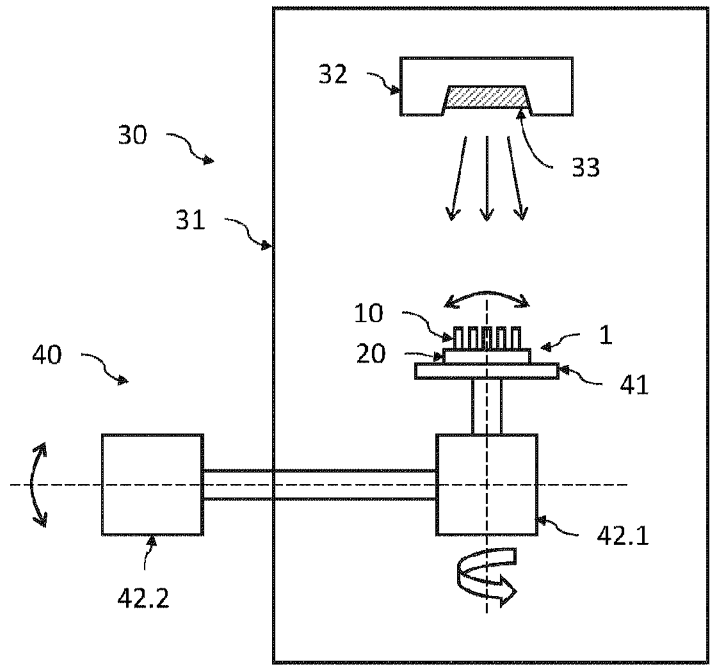
FIG. 3A illustrates a reactor for depositing the lower thin film electrode according to a first embodiment, in which the substrate support can rotate about the main axis $A_s$ of the substrate, with this main axis $A_s$ also experiencing a planar angular oscillation movement about the main deposition direction $D_d$, and more specifically about a fixed axis $A_f$ parallel to the main deposition direction $D_d$ and intersecting the main axis $A_s$, so that the angle of inclination $\alpha$ varies between at most $-\alpha_{th}$ and $+\alpha_{th}$.
Figure 4A:
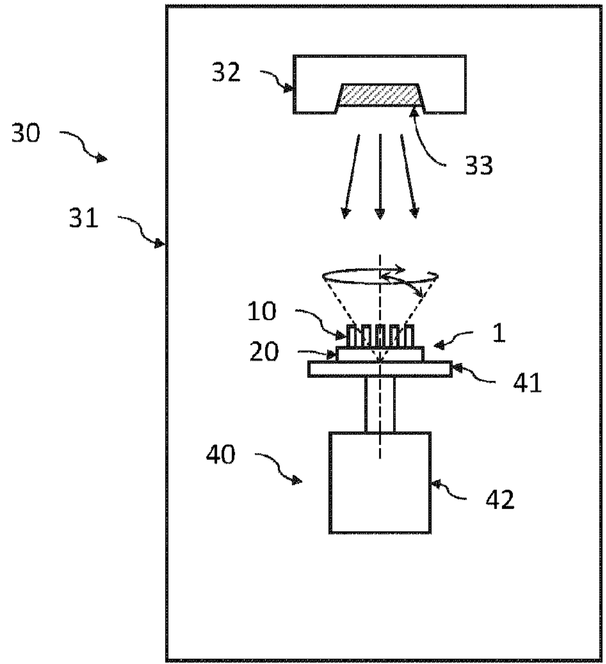
FIG. 4A illustrates a reactor for depositing the lower thin film electrode according to a second embodiment, in which the substrate support cannot rotate about the main axis $A_s$ (unlike the case in FIG. 3A), but experiences a rotation movement of the main axis $A_s$ of the substrate about a fixed axis $A_f$ parallel to the main deposition direction $D_d$, as well as an angular oscillation movement, so that the angle of inclination $\alpha$ varies between 0° and at most $\alpha_{th}$.

In these examples, the substrate 20 rests on a support 41 of a substrate holder (see FIGS. 3A and 4A). During the step of producing the conductive thin film 23, the support 41 can rotate about the main axis $A_s$ of the substrate 20.

FIG. 2A illustrates the case where directional deposition is carried out with a constant angle of incidence $\alpha$ that is equal to zero: the main axis $A_s$ is parallel to the main deposition direction $D_d$. The conductive thin film 23 then continuously extends over the substrate 20 (i.e., in this case over the dielectric film 22), between the wire diodes 10, as well as over an upper surface thereof. The contact surface of the conductive thin film 23 on the feet of the wire diodes 10 is negligible since the conductive thin film 23 does not run along part of the wire diodes 10 (not a conformal deposit). In addition, physical and therefore electrical contact is not ensured because the deposition of the conductive thin film 23 is not directed towards the semiconductor 11. This results in poor injection of the charge carriers into the first doped portions 11.

FIG. 2B illustrates the case whereby directional deposition is carried out with a constant angle of incidence $\alpha$ that is greater than (strictly) the threshold value $\alpha_{th}$. It then appears that the high spacing aspect ratio, in this case of the order of approximately 4, causes a shading effect by the wire diodes 10, which prevents the incident material flow from reaching the surface of the substrate 20. Furthermore, the conductive thin film 23 is only deposited on an upper part of the wire diodes 10, and not on the lower part of the wire diodes 10 nor on the surface of the substrate 20. Moreover, the conductive thin film 23 cannot provide an electrical biasing function.

FIG. 2C illustrates the case whereby directional deposition is carried out with a constant angle of incidence $\alpha$ ranging between 0 (not included) and the threshold value $\alpha_{th}$. Since the angle of incidence $\alpha$ is less than or equal to the threshold value $\alpha_{th}$, the conductive thin film 23 is deposited on the entire surface of the wire diodes 10, as well as on part of the surface of the substrate 20 that surrounds the wire diodes 10. However, the angle of incidence $\alpha$ is non-zero, so that the flow of material does not reach part of the surface of the substrate 20 that surrounds each wire diode 10. In this case, this also results in a lack of continuity of the surface area coverage of the conductive thin film 23, so that it is not possible to electrically bias all the wire diodes 10 because they are then not connected in parallel by the deposited conductive thin film 23.

Furthermore, according to the invention, the conductive thin film 23 is produced by directional deposition and by combining a rotation movement with an angular oscillation movement of the substrate 20. Thus, the conductive thin film 23 is deposited on the substrate 20 and on the entire surface, or at least a lower part, of the wire diodes 10 in a continuous and conformal manner. The conductive thin film 23 can then form a lower thin film electrode, deposited on the front face of the substrate 20, and which provides an electrical bias for the wire diodes 10.

Two main embodiments are described hereafter. In a first embodiment, the substrate 20 experiences a rotation movement about its main axis $A_s$ at a rotation frequency $f_r$, as well as an angular oscillation movement of the main axis $A_s$ relative to a fixed axis $A_f$ parallel to the main deposition direction $D_d$ at an angular oscillation frequency $f_o$, so that the angle of incidence $\alpha$ varies between $-\alpha_m$ and $+\alpha_m$, where the maximum value $\alpha_m$ is at most equal to the threshold value $\alpha_{th}$. In this case, the angular oscillation movement occurs in a plane containing the fixed axis $A_f$.

In a second embodiment, the substrate 20 experiences a rotation movement of its main axis $A_s$ about a fixed axis $A_f$ parallel to the main deposition direction $D_d$, with the fixed axis $A_f$ intersecting the main axis $A_s$, at a rotation frequency $f_r$, as well as an angular oscillation movement of the angle of incidence $\alpha$ (which then forms a nutation angle) at an angular oscillation frequency $f_o$ so that the angle of incidence $\alpha$ varies between 0 and $+\alpha_m$, where the maximum value $\alpha_m$ is less than or equal to the threshold value $\alpha_{th}$. In this embodiment, the substrate 20 does not rotate about its main axis $A_s$ (this can be referred to as a precession movement of the axis $A_s$ about the axis $A_f$ at a variable precession angle $\alpha$).

In these two embodiments, the rotation frequency $f_r$ and the angular oscillation frequency $f_o$ are predefined so that the conductive thin film is deposited on the substrate and on the wire diodes 10 in a continuous and conformal manner.

Figure 3B:
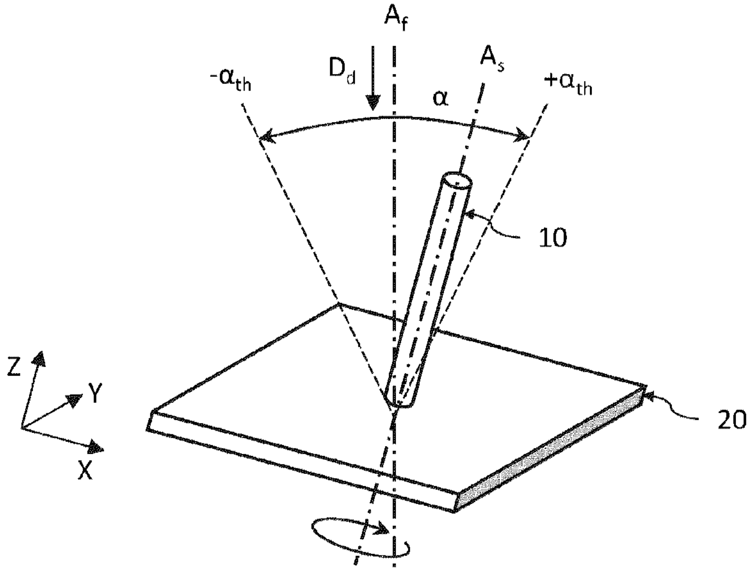
FIG. 3B illustrates part of the optoelectronic device during the step of producing the lower thin film electrode in the reactor illustrated in FIG. 3A, highlighting the rotation and angular oscillation movements of the substrate.

FIG. 3A is a schematic and partial cross-sectional view of a thin film deposition reactor 30 and of an optoelectronic device 1 being manufactured, according to the first embodiment. FIG. 3B schematically illustrates the substrate 20 and a wire diode 10 during the step of producing the conductive thin film 23 in the reactor of FIG. 3A.

The reactor 30 is a directional physical vapour deposition reactor, for example, of the evaporation or IBS sputtering type, among others. It comprises a sealed chamber 31, which houses a crucible 32 receiving the sample 33 of the conductive material to be deposited. It also comprises a substrate holder 40 adapted to ensure the rotation movement and the angular oscillation movement of the substrate 20.

The substrate holder 40 comprises a support 41 for receiving the substrate 20, and a mechanical device for moving the support 41. This mechanical device in this case comprises a first motor 42.1 ensuring the rotation movement about a main axis of the support 41, which in this case is collinear with the main axis $A_s$ of the substrate 20. It also comprises a second motor 42.2 ensuring the angular oscillation movement of the main axis $A_s$ relative to a fixed axis $A_f$. This fixed axis $A_f$ in this case passes through the centre of the crucible 32 and through the centre of rotation of the substrate 20. In this example, the motor 42.1 is located inside the chamber 31 and the motor 42.2 is located outside, with the connections being provided by sealed passages. Of course, other arrangements are possible.

By way of an example, the threshold value $\alpha_{th}$ is equal to 5°, which corresponds to an h:d spacing aspect ratio that is equal to approximately 10, for example, for an average height h of the order of 1,000 nm and an average relative spacing d of the order of 100 nm. The angular oscillation is even between −5° and +5°, and one oscillation can be completed in a few seconds. Furthermore, several angular oscillations are completed throughout the duration of the step of producing the conductive thin film. In addition, the rotation frequency $f_r$ can be of the order of 10 rpm.

Preferably, to prevent the incident material flow from always encountering the same surface of the sides of the wire diodes 10, the rotation frequency $f_r$ and the angular oscillation frequency $f_o$ are mutually prime numbers, in the sense that they do not have a common multiplier. In other words, the rotation frequency $f_r$ is not a multiple of the angular oscillation frequency $f_o$, and vice versa. However, in this case these conditions are advantageous but not strictly necessary. Indeed, if the frequencies $f_r$ and $f_o$ are not mutually prime numbers but differ slightly, for example, to the nearest 10% or even less, the conductive thin film 23 will still be deposited on the surface of the substrate 20 and on the wire diodes 10 in a continuous and conformal manner if the deposition method lasts long enough for all parts of the wire diodes to be exposed to the flow of material of the film 23. Furthermore, if the angular oscillation frequency $f_o$ is a multiple of the rotation frequency $f_r$, but is much higher, for example, with a ratio of 10 or even more, or vice versa, the conductive thin film 23 will also be deposited in a continuous and conformal manner.

Figure 4B:
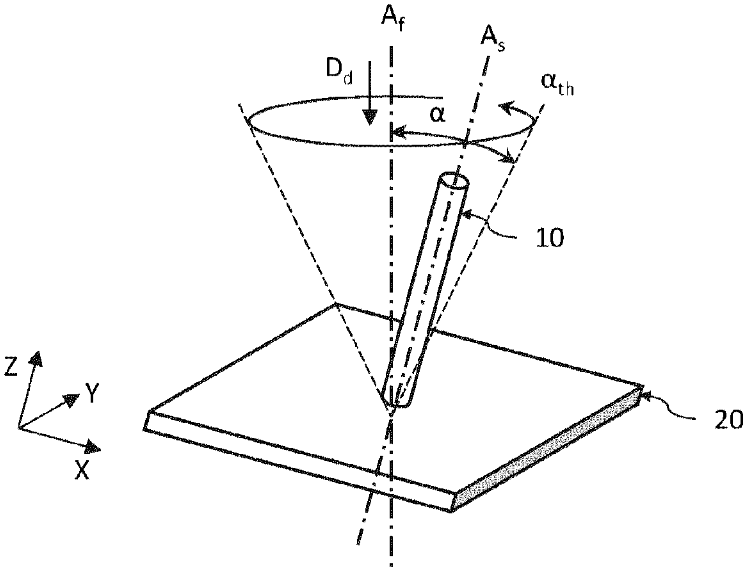
FIG. 4B illustrates part of the optoelectronic device during the step of producing the lower thin film electrode illustrated in FIG. 4A, highlighting the rotation movements of the main axis $A_s$ of the substrate about the fixed axis $A_f$ and the angular oscillation of the substrate.

FIG. 4A is a schematic and partial cross-sectional view of a thin film deposition reactor 30 and of the optoelectronic device 1 being manufactured, according to the second embodiment. FIG. 4B schematically illustrates the substrate 20 and a wire diode 10 during the step of producing the conductive thin film 23 in the reactor of FIG. 4A.

The reactor 30 in this case is also a directional physical vapour deposition reactor, for example, of the evaporation or IBS sputtering type, among others. It comprises a sealed chamber 31, which houses a crucible 32 (or a target 32 in the case of IBS deposition) receiving the sample 33 of the conductive material to be deposited. It also comprises a substrate holder 40 adapted to ensure the rotation movement of the main axis $A_s$ about the fixed axis $A_f$, as well as the angular oscillation movement of the main axis $A_s$.

In this example, the mechanical device of the substrate holder 40 comprises the same motor 42, in this case located in the chamber 31, providing these two movements. Of course, other arrangements are possible.

An example of a method for manufacturing the optoelectronic device 1, in this case according to the first embodiment, will now be described with reference to FIGS. 5A to 5E. The materials of the various films are provided in this case by way of an illustration and other materials can be used.

With reference to FIG. 5A, a nucleation film 21 is deposited on the front face of the silicon substrate 20, followed by a dielectric film 22 (growth mask) made of SiN comprising through-openings opening onto the nucleation film 21. The GaN-based wire diodes 10 are then produced from the nucleation film 21 by epitaxial growth through the through-openings. The wire diodes 10 in this case have an average height h ranging between approximately 800 nm and 1,200 nm, and an average relative spacing d ranging between approximately 80 nm and 120 nm. A threshold value $\alpha_{th}$ of the angle of inclination $\alpha$ is then deduced therefrom, ranging between 4° and 6°, i.e., in this case of the order of approximately 5°.

With reference to FIG. 5B, the conductive thin film 23 is produced so that it extends over the substrate 20 (in this case over the dielectric film 22) in a continuous and conformal manner. It is made of an electrically conductive material, for example, aluminium in this case. Deposition is carried out by directional physical vapour deposition, for example, by evaporation or IBS sputtering, in a main deposition direction $D_d$. In this example, the support (not shown), and therefore the substrate 20, experience a rotation movement about the main axis $A_s$ at a rotation frequency $f_r$ that is equal to approximately 10 rpm, as well as an angular oscillation movement about the fixed axis $A_f$ parallel to the main deposition direction $D_d$ at an angular oscillation frequency $f_o$ of the order of approximately 0.25 Hz, and with an amplitude ranging between approximately −5° and +5°.

With reference to FIG. 5C, an etching mask 26 (resin) is then deposited on the obtained structure, for example, by spin coating, followed by $O_2$ plasma thinning, so that it has an even thickness along the Z axis and covers only a lower part of the wire diodes 10. Furthermore, the etching mask 26 covers the part of the conductive thin film 23 that extends over the substrate 20 and a part that extends in contact with the lower part of the wire diodes 10. It leaves part of the conductive thin film 23 free that extends over an upper part of the wire diodes 10 (which includes the active zone 12 and the second doped portion 13).

With reference to FIG. 5D, the free part of the conductive thin film 23, namely, in this case, the part that covers the upper part of the wire diodes 10, is selectively etched (wet chemical etching, for example, using a commercial solution called Aluminium Etch, at room temperature). The corresponding surface of the wire diodes 10 is then rendered free.

With reference to FIG. 5E, the etching mask 26 is removed, for example, by using a solvent bath such as acetone. A conductive thin film 23 is then obtained that extends over the substrate 20 (in the XY plane) and over a lower part of the wire diodes 10 (along the Z axis) in a continuous and conformal manner. The part of the conductive thin film 23 extends over the wire diodes 10 over a height $h_{ei}$ that is greater than the thickness $e_{ei}$ of the film resting on the substrate 20. The method for manufacturing the optoelectronic device then can be continued, for example, by depositing an encapsulation film and then a conductive thin film forming an upper electrode. Contact pads then can be deposited in contact with the lower conductive thin film (lower electrode) and the upper conductive thin film (upper electrode) to allow electrical biasing of the wire diodes.

Particular embodiments have been described above. Various alternative embodiments and modifications will become apparent to a person skilled in the art.

The invention claimed is:

1. Method A manufacturing method for manufacturing an optoelectronic device comprising: a substrate, and a plurality of wire diodes for emitting or detecting light resting on the substrate, each having an average height h and being spaced apart with an average relative spacing d from side to side, such that an h:d spacing aspect ratio is at least equal to 1, the method comprising:

producing a lower conductive thin film, made of at least one electrically conductive material, to form a lower electrode by performing directional physical vapour deposition in a main deposition direction oriented towards the substrate and the wire diodes, resulting in an incident material flow of the electrically conductive material, wherein the substrate rests on a support of a substrate holder, the support experiencing a periodic rotational movement so that sides of the wire diodes are exposed to the incident material flow at a rotation frequency, and a periodic oscillation movement of an angle of inclination formed between a main axis orthogonal to the substrate and a fixed axis parallel to the main deposition direction ranging at most up to a threshold value equal to arctan and including the value 0°, at an angular oscillation frequency; and the frequencies of rotation and of angular oscillation being predefined so that the lower conductive thin film is deposited on the substrate and the sides of the wire diodes in a conformal and continuous manner.

2. The manufacturing method according to claim 1, wherein the step of producing the lower conductive thin film is performed by evaporation or ion beam sputtering.

3. The manufacturing method according to claim 1, wherein the support and the substrate experience a rotation movement about the main axis and an angular oscillation movement of the main axis relative to the fixed axis, so that the angle of incidence varies between $-\alpha_m$ and $+\alpha_m$, where the maximum value $\alpha_m$ is at most equal to the threshold value.

4. The manufacturing method according to claim 1, wherein the support and the substrate experience a rotation movement of the main axis about the fixed axis, with the fixed axis intersecting the main axis, and experience an angular oscillation movement of the angle of incidence, so that the angle of incidence varies between 0 and $+\alpha_m$, where the maximum value $\alpha_m$ is at most equal to the threshold value.

5. The manufacturing method according to claim 1, wherein the wire diodes are produced from an III-V compound comprising at least one element from column III and at least one element from column V of the periodic table, from an II-VI compound comprising at least one element from column II and at least one element from column VI of the periodic table, or from an IV element or compound comprising at least one element from column IV of the periodic table.

6. The manufacturing method according to claim 1, wherein the wire diodes have the average height h ranging between 500 nm and 5,000 nm, and the average relative spacing ranges between 50 nm and 500 nm, while complying with a spacing aspect ratio that is at least equal to 1.

7. The manufacturing method according to claim 1, wherein, during the step of producing the lower conductive thin film, the wire diodes are completely covered by the lower conductive thin film.

8. The manufacturing method according to claim 1, wherein the wire diodes comprise, starting from the substrate and along the main axis, a first portion doped according to a first type of conductivity, an active zone and a second portion doped according to a second type of conductivity opposite to the first type.

9. The manufacturing method according to claim 8, further comprising a step of removing part of the lower conductive thin film extending over the active zone and the second doped portion, in order to retain only part of the lower conductive thin film extending over the first doped portion.

10. The manufacturing method according to claim 9, wherein the removal step is performed so that, subsequently, the lower conductive thin film extends over the first doped portion of the wire diodes to a height that is greater than a thickness of the lower conductive thin film extending over the substrate.

11. The manufacturing method according to claim 1, wherein the rotation frequency and the angular oscillation frequency are mutually prime numbers.

12. The manufacturing method according to claim 1, wherein the angular oscillation frequency is a multiple of the rotation frequency, or vice versa, with a ratio that is at least equal to 10.

* * * * *